(12) United States Patent
Wang et al.

(10) Patent No.: US 11,670,884 B2
(45) Date of Patent: Jun. 6, 2023

(54) SINGLE-ROW ELECTRICAL WIRE STRUCTURE

(71) Applicant: ADVANCED-CONNECTEK INC., New Taipei (TW)

(72) Inventors: Wen-Yu Wang, New Taipei (TW); Tzu-Hao Li, New Taipei (TW)

(73) Assignee: ADVANCED-CONNECTEK INC., New Taipei (TW)

( * ) Notice: Subject to any disclaimer, the term of this patent is extended or adjusted under 35 U.S.C. 154(b) by 111 days.

(21) Appl. No.: 17/198,530

(22) Filed: Mar. 11, 2021

(65) Prior Publication Data

US 2021/0288426 A1    Sep. 16, 2021

(30) Foreign Application Priority Data

Mar. 12, 2020   (TW) .................................. 109202864

(51) Int. Cl.
*H01R 12/73*   (2011.01)
*H01R 12/72*   (2011.01)
*H01R 12/53*   (2011.01)

(52) U.S. Cl.
CPC .......... *H01R 12/732* (2013.01); *H01R 12/53* (2013.01); *H01R 12/725* (2013.01); *H01R 12/727* (2013.01)

(58) Field of Classification Search
CPC ....... H05K 2201/10356; H05K 1/0221; H05K 1/0225; H05K 1/0243; H05K 1/111; H05K 1/117; H05K 9/0098; H05K 3/341; H05K 3/3405; H05K 2201/10189; H05K 2201/09409; H05K 2201/0923; H01R 13/6658; H01R 13/6275; H01R 24/60; H01R 12/53; H01R 12/62; H01R 13/512; H01R 13/6581; H01R 12/716; H01R 12/79; H01R 13/405; H01R 13/6585; H01R 13/65915; H01R 13/6592; H01R 2107/00; H01R 13/6471; H01R 12/7076;

(Continued)

(56) References Cited

U.S. PATENT DOCUMENTS 7,410,365 B2 * 8/2008 Wu ....................... H01R 13/512
                                                            439/358
7,690,930 B2 * 4/2010 Chen ..................... H05K 1/0243
                                                            439/76.1

(Continued)

*Primary Examiner* — Oscar C Jimenez
*Assistant Examiner* — Paul D Baillargeon
(74) *Attorney, Agent, or Firm* — Muncy Geissler Olds & Lowe P.C.

(57) ABSTRACT

A single-row electrical wire structure includes a first circuit board and a wire assembly. A board-to-board connector is on the first circuit board. The first circuit board includes a first group of contacts arranged into a single row. A distance between center portions of adjacent two contacts of the first group of contacts forms a width. The wires assembly includes a plurality of high-speed signal pairs and at least one low-speed signal pair respectively connected to the first group of contacts. A first spacing between a contact in the first group of contacts corresponding to a first high-speed signal pair of the high-speed signal pairs and a contact in the first group of contacts corresponding to a second high-speed signal pair of the high-speed signal pairs adjacent to the first high-speed signal pair is at least equal to or greater than 2 times of the width.

11 Claims, 17 Drawing Sheets

(58) Field of Classification Search
CPC ........ H01R 12/70; H01R 12/61; H01R 12/57; H01R 4/023; H01R 12/732; H01R 12/725; H01R 12/727; H01R 12/63
See application file for complete search history.

(56) References Cited

U.S. PATENT DOCUMENTS

| | | | |
|---|---|---|---|
| 9,397,447 B2* | 7/2016 | Kurachi | H01R 13/04 |
| 9,768,568 B1* | 9/2017 | Jin | H01R 24/60 |
| 9,979,145 B2* | 5/2018 | Wu | H05K 1/111 |
| 9,985,367 B2* | 5/2018 | Wanha | H01R 13/6477 |
| 10,312,609 B2* | 6/2019 | Kawate | H01B 11/203 |
| 10,737,342 B2* | 8/2020 | Wu | H01R 12/778 |
| 10,777,951 B2* | 9/2020 | Wu | H01R 12/70 |
| 2005/0130490 A1* | 6/2005 | Rose | H01R 13/512 |
| | | | 439/483 |
| 2011/0083889 A1* | 4/2011 | Niitsu | H05K 1/119 |
| | | | 174/258 |
| 2016/0351298 A1* | 12/2016 | Gundel | H01B 7/0861 |

\* cited by examiner

SINGLE-ROW ELECTRICAL WIRE STRUCTURE

CROSS-REFERENCE TO RELATED APPLICATION

This non-provisional application claims priority under 35 U.S.C. § 119(a) to Patent Application No. 109202864 filed in Taiwan, R.O.C. on Mar. 12, 2020, the entire contents of which are hereby incorporated by reference.

FIELD OF THE INVENTION

The instant disclosure relates to an electrical wire structure, and more particular to a single-row electrical wire structure.

BACKGROUND

Consumer electronics tend to become smaller, thinner, and lighter. The electrical connection between the circuit boards with electrical wires is a common configuration in the consumer electronics. Hence, the layout of the first circuit board can be extended through the electrical wires, so that the internal space of the consumer electronics can be properly arranged. For an electronic device (e.g., a notebook computer), the size of the electronic device is small, and the electronic device has a relatively limited internal space. Therefore, the circuit boards are electrically connected with each other through electrical wires or board-to-board electrical connector(s), so that the electronic device can have better space utilization.

SUMMARY OF THE INVENTION

In general, the electrical wires are arranged into a one-row flat cable structure, and the flat cable structure has thirty data wires. Further, in order to meet the USB signal transmission interface, the flat cable structure has several power wires, several ground wires, four pairs of high-speed signal wires, and two low-speed signal wires, etc.

The pitch assignment of the thirty data wires in the one-row flat cable structure is shown as the following table.

| Position   | 1    | 2    | 3    | 4   | 5    | 6    |
|------------|------|------|------|-----|------|------|
| Definition | Vbus | Vbus | Vbus | GND | TX1  | TX1  |
| Position   | 7    | 8    | 9    | 10  | 11   | 12   |
| Definition | GND  | RX1  | RX1  | GND | CC   | GND  |
| Position   | 13   | 14   | 15   | 16  | 17   | 18   |
| Definition | SUB2 | GND  | D+   | D−  | GND  | SUB1 |
| Position   | 19   | 20   | 21   | 22  | 23   | 24   |
| Definition | GND  | CC2  | GND  | TX2 | TX2  | GND  |
| Position   | 25   | 26   | 27   | 28  | 29   | 30   |
| Definition | RX2  | RX2  | GND  | Vbus| Vbus | Vbus |

In the flat cable structure, since two ground wires are respectively arranged at two sides of each pair of the high-speed differential signal wires, two sides of the pair of the low-speed differential signal wires, two sides of each of the common mode auxiliary data signal wires, two sides of each of the common mode auxiliary control signal wires, and two sides of each of the E-MAK chip power supply voltage signal wires, the flat cable structure has a larger width and has following problems.

The first problem is the greater amount of used material and the higher cost needed by the flat cable structure. In detail, ground wires are arranged at two sides of each of the signal pairs and at two sides of each of the signal wires. Moreover, the number of the data wires used in the flat cable structure is excessive; the flat cable structure has thirty data wires so as to have a higher cost.

The second problem is the interference between the high-speed signals. For example, in the case that the flat cable structure has 42 AWG wires, the distance between adjacent wires may be too close. As a result, the signals of the adjacent high-speed signal pairs may be interfered with each other to cause improper crosstalk.

The third problem is the electromagnetic interference (EMI)/radiofrequency interference (RFI) issue. The welding regions of the flat cable structure for the type-C connector and for another plug connector are just covered with UV glues, and the welding regions are not shielded with any metallic shell. As a result, when the flat cable structure is used for high-speed signal transmissions, EMI/RFI problems may occur easily.

One embodiment of the instant disclosure provides a single-row electrical wire structure. The single-row electrical wire structure comprises a first circuit board and a wire assembly. A board-to-board connector is on the first circuit board. The first circuit board comprises a first group of contacts arranged into a single row. A distance between center portions of adjacent two contacts of the first group of contacts forms a width. The wires assembly comprises a plurality of high-speed signal pairs and at least one low-speed signal pair. One of two ends of each of the high-speed signal pairs and one of two ends of the at least one low-speed signal pair are connected to the first group of contacts. A first spacing between a contact in the first group of contacts corresponding to a first high-speed signal pair of the high-speed signal pairs and a contact in the first group of contacts corresponding to a second high-speed signal pair of the high-speed signal pairs adjacent to the first high-speed signal pair is at least equal to or greater than 2 times of the width.

In one or some embodiments, the single-row electrical wire structure further comprises a second circuit board. An electrical connector is on the second circuit board. The second circuit board comprises a second group of contacts arranged into a single row, and the second group of contacts is connected to the other end of the wire assembly.

In one or some embodiments, the wire assembly comprises a plurality of the low-speed signal pairs. A second spacing between a contact in the first group of contacts corresponding to a first low-speed signal pair of the low-speed signal pairs and a contact in the first group of contacts corresponding to a second low-speed signal pair of the low-speed signal pairs adjacent to the first low-speed signal pair is at least equal to or greater than 1.5 times of the width.

In one or some embodiments, the single-row electrical wire structure further comprises a low-speed signal wire. The low-speed signal wire is a coaxial wire or an electronic wire. The high-speed signal pairs and the at least one signal pair are coaxial wires, twin coaxial wires, or electronic wires.

In one or some embodiments, the low-speed signal wire, the high-speed signal pairs, and the at least one low-speed signal pair are the coaxial wires and respectively comprise a conductive layer. The conductive layers are connected to a grounding sheet.

In one or some embodiments, the single-row electrical wire structure further comprises at least one grounding sheet at upper and lower portions of a side portion of each of the high-speed signal pairs and at upper and lower portions of a side portion of the at least one low-speed signal pair.

In one or some embodiments, a plurality of block members extends from a side portion of the at least one grounding sheet, and each of the block members is electrically connected to the first circuit board.

In one or some embodiments, side portions of the grounding sheets flush with a side portion of the first circuit board. Alternatively, the side portions of the grounding sheets protrude from the side portion of the first circuit board.

In one or some embodiments, a portion of the at least one grounding sheet protruding from a side portion of the first circuit board is in contact with a metallic covering member.

In one or some embodiments, the single-row electrical wire structure further comprises at least one electronic wire. The at least one electronic wire is at least one of two sides of the wire assembly and connected to the first circuit board.

In one or some embodiment, the single-row electrical wire structure further comprises a first outer cover. The first outer cover is on the first circuit board to cover the high-speed signal pairs.

According to one or some embodiments of the single-row electrical wire structure of the instant disclosure, the amount of used material for the wire assembly is reduced, the spacing between the high-speed signal pairs are increased, and the crosstalk interferences are improved with altering the arrangement of the wires. Two sides of each of the signal pairs and two sides of each of the signal wires are devoid of the ground wires, and the signal pairs and wires are shielded with the metallic shell, thereby preventing from the EMI/RFI issues upon transmitting high-speed signals. Moreover, the height of the single-row electrical wire structure is slightly less than the height of the dual-row electrical wire structure. Furthermore, the grounding sheets are held at the two ends of the wire assembly and fixed on the first circuit, the grounding sheets are in contact with the conductive layers of the wire assembly and electrically connected to the first circuit board so as to provide conduction and grounding effects.

Detailed description of the characteristics and the advantages of the instant disclosure are shown in the following embodiments. The technical content and the implementation of the instant disclosure should be readily apparent to any person skilled in the art from the detailed description, and the purposes and the advantages of the instant disclosure should be readily understood by any person skilled in the art with reference to content, claims, and drawings in the instant disclosure.

BRIEF DESCRIPTION OF THE DRAWINGS

The instant disclosure will become more fully understood from the detailed description given herein below for illustration only, and thus not limitative of the instant disclosure, wherein.

DETAILED DESCRIPTION

Figure 1:
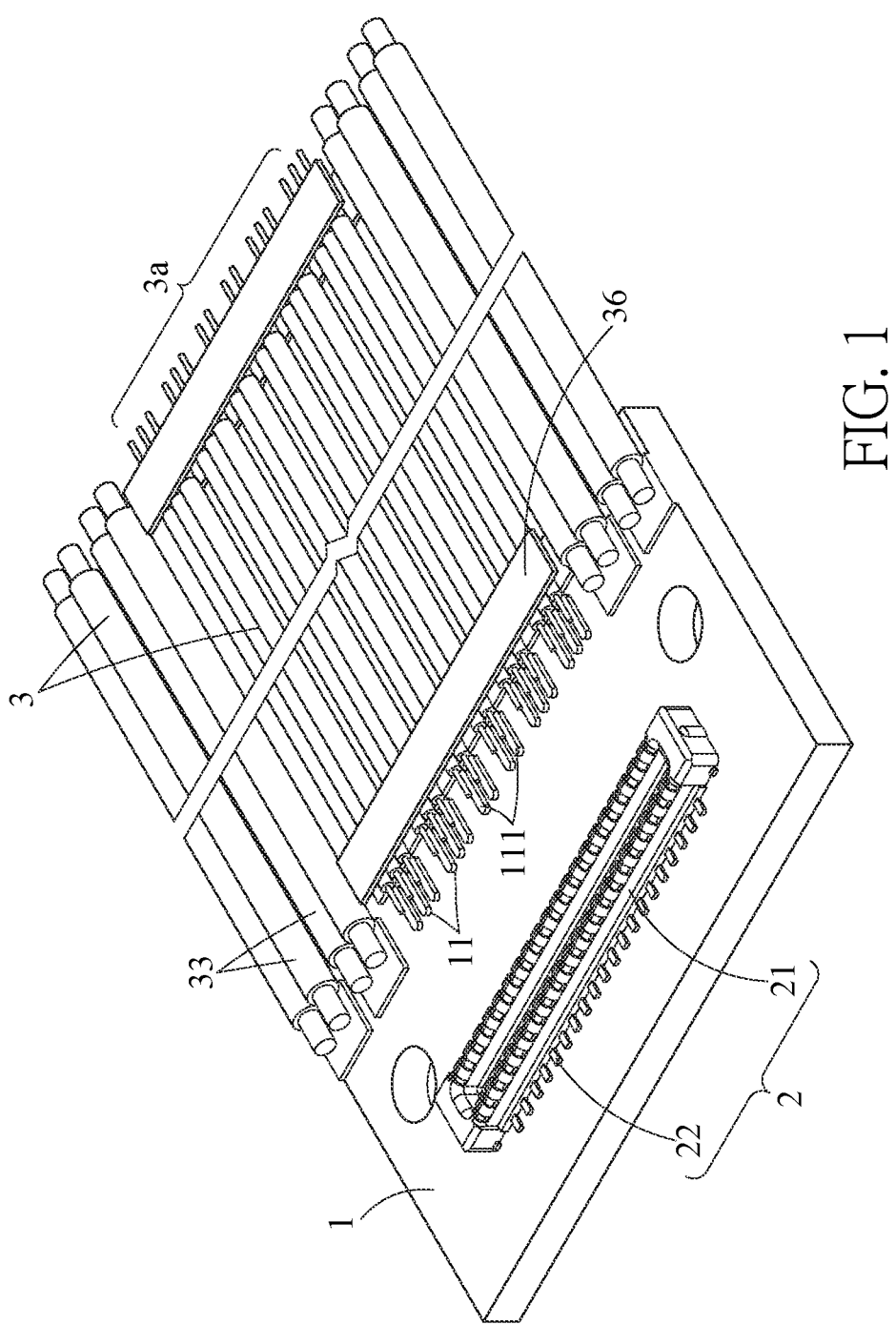
FIG. 1 illustrates a perspective view of a single-row electrical wire structure according to a first embodiment of the instant disclosure.
Figure 2:
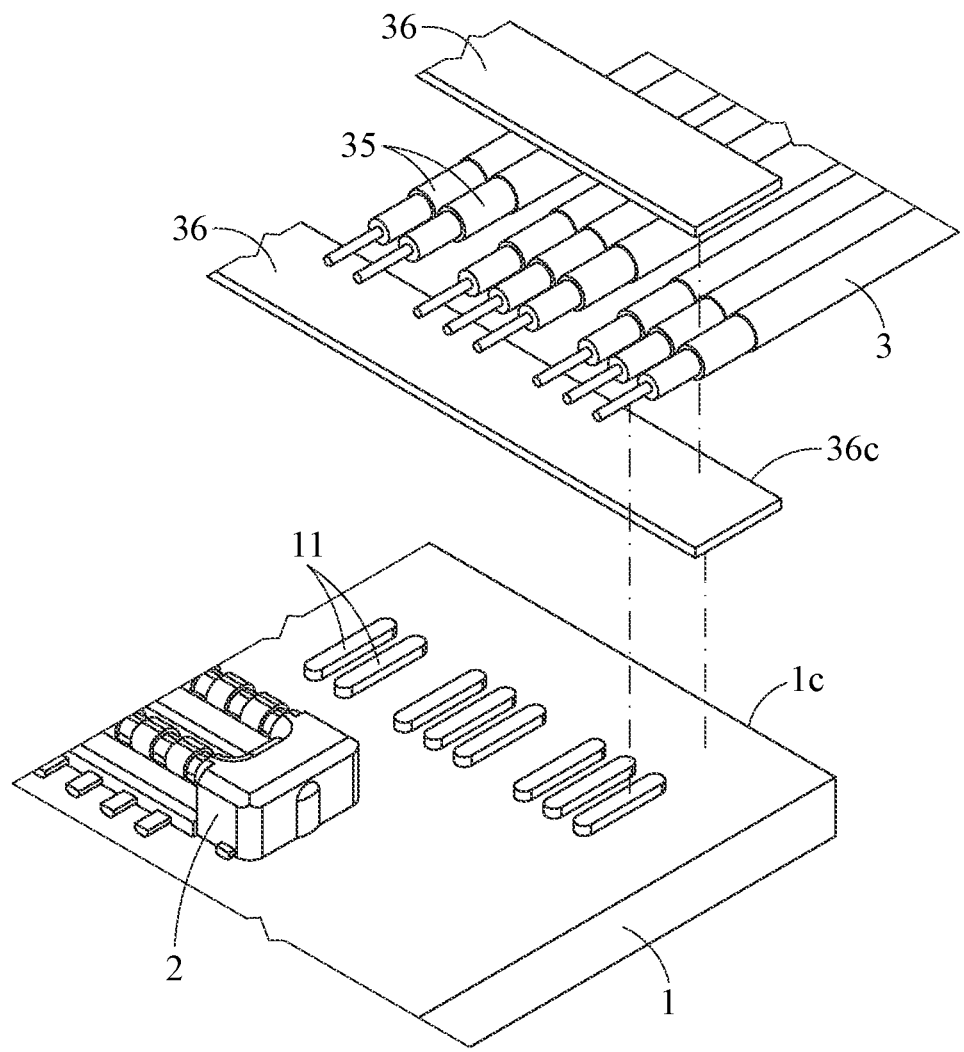
FIG. 2 illustrates an exploded view of the single-row electrical wire structure of the first embodiment.
Figure 3:
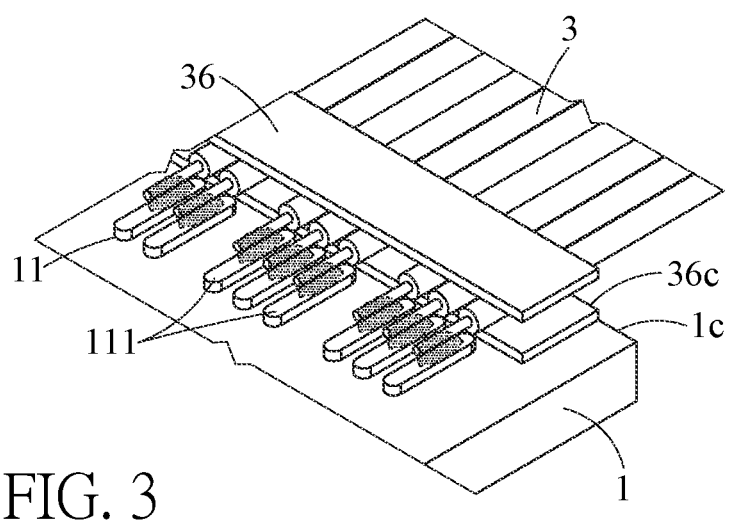
FIG. 3 illustrates a schematic perspective view showing the single-row electrical wire structure of the first embodiment is to be welded.
Figure 4:
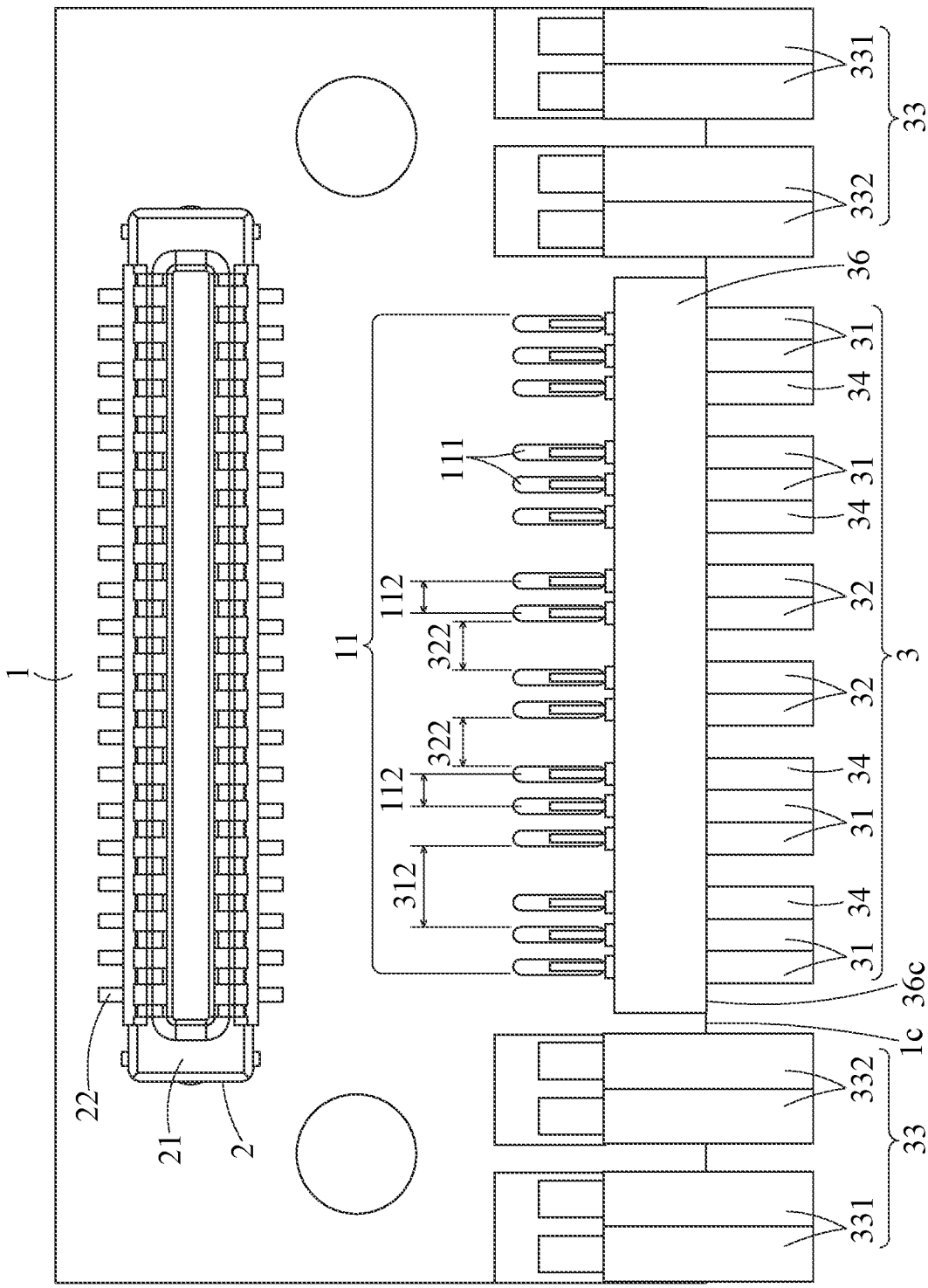
FIG. 4 illustrates a top view of the single-row electrical wire structure of the first embodiment.
Figure 5:
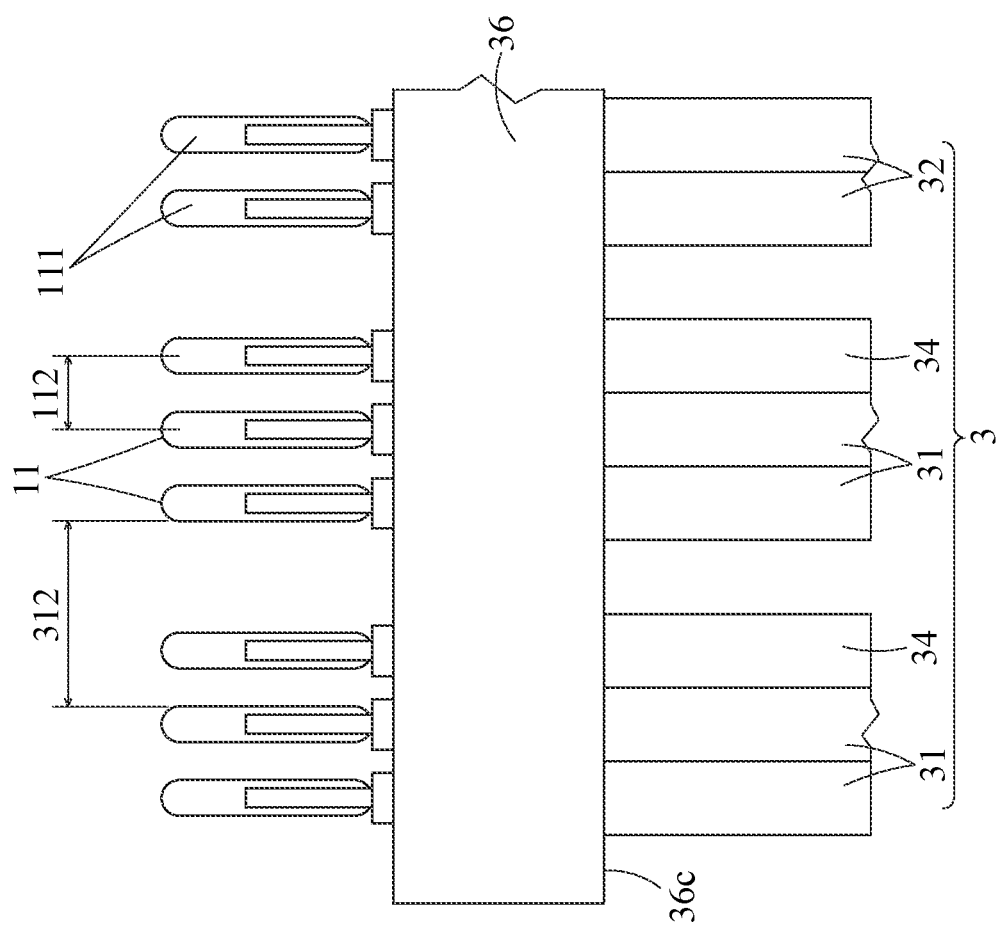
FIG. 5 illustrates an enlarged partial view (1) of FIG. 4.
Figure 6:
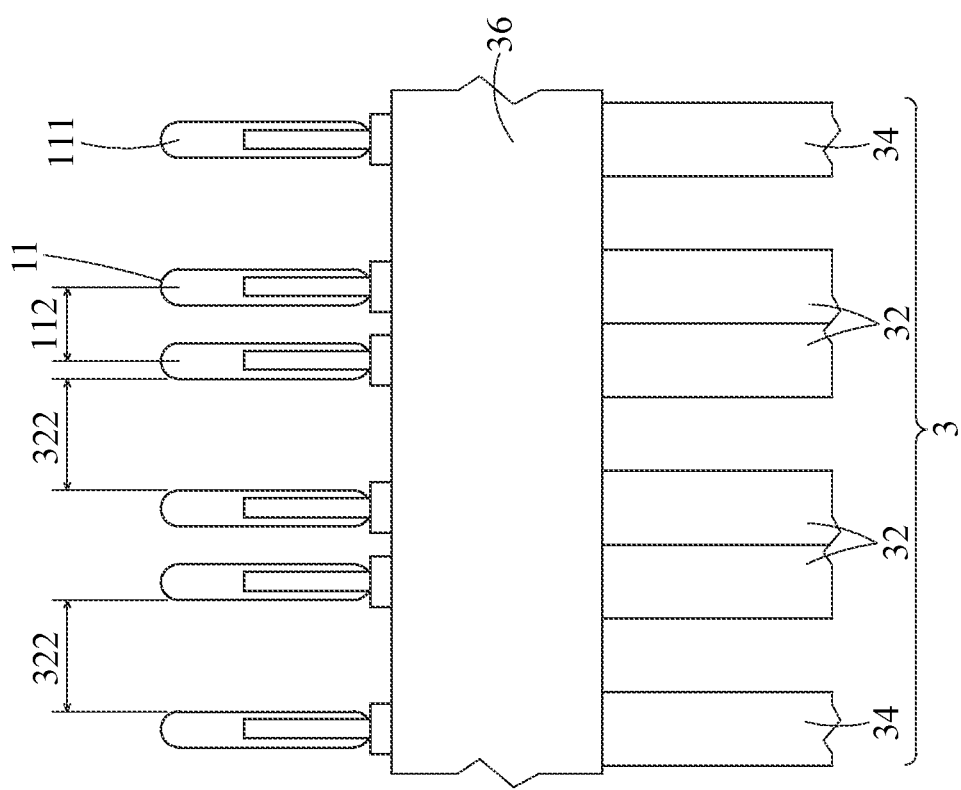
FIG. 6 illustrates an enlarged partial view (2) of FIG. 4.

Please refer to FIGS. 1 to 6. A single-row electrical wire structure according to a first embodiment of the instant disclosure is illustrated. FIG. 1 illustrates a perspective view of a single-row electrical wire structure according to the first embodiment. FIG. 2 illustrates an exploded view of the single-row electrical wire structure of the first embodiment. FIG. 3 illustrates a schematic perspective view showing the single-row electrical wire structure of the first embodiment is to be welded. FIG. 4 illustrates a top view of the single-row electrical wire structure of the first embodiment. FIG. 5 illustrates an enlarged partial view (1) of FIG. 4. FIG. 6 illustrates an enlarged partial view (2) of FIG. 4. In this embodiment, the single-row electrical wire structure comprises a first circuit board 1, a wire assembly 3, and a second circuit board 6.

In this embodiment, a board-to-board connector 2 is on the first circuit board 1. The first circuit board 1 comprises a first group of contacts 11 arranged into a single row. A distance between center portions of adjacent two contacts 111 (electrical wire and welding pad) of the first group of contacts 11 forms a width 112 between the contacts. More specifically, in this embodiment, the widths 112 between different adjacent two contacts 111 of the first group of contacts 11 are the same, and the number of the adjacent two contacts 111 of the first group of contacts 11 may increase or decrease according to different product requirements.

In this embodiment, the wire assembly 3 comprises a plurality of high-speed signal pairs 31 and at least one low-speed signal pair 32. One of two ends of each of the high-speed signal pairs 31 and one of two ends of the at least one low-speed signal pair 32 are connected to the first group of contacts 11. A first spacing 312 between a contact 111 in the first group of contacts 11 connected to a first high-speed signal pair of the high-speed signal pairs 31 and a contact 111 in the first group of contacts 11 connected to a second high-speed signal pair of the high-speed signal pairs 31 adjacent to the first high-speed signal pair is at least equal to or greater than 2 times of the width 112. Specifically, in this embodiment, two sides of the signal pairs or two sides of the signal wires are devoid of ground wires.

In this embodiment, an electrical connector is on the second circuit board 6. The second circuit board 6 comprises a second group of contacts 61 arranged into a single row, and contacts in the second group of contacts 61 are respectively connected to the other end of the wire assembly 3.

In this embodiment, more specifically, a second spacing 322 between a contact 111 in the first group of contacts 11 connected to a first low-speed signal wire of low-speed signal wires 34 of the wire assembly 3 and a contact 111 in the first group of contacts 11 connected to a second low-speed signal wire of the low-speed signal wires 34 or connected to the at least one low-speed signal pair 32 adjacent to the first low-speed signal wire is at least equal to or greater than 1.5 times of the width 112.

In this embodiment, more specifically, the first group of contacts 11 may be on an upper surface of a lower surface of the first circuit board 1, and the board-to-board connector 2 may be disposed on the upper surface or the lower surface of the first circuit board 1.

In this embodiment, more specifically, the board-to-board connector 2 comprises an insulated housing 21 and a plurality of terminals 22 at the insulated housing 21. Moreover, the board-to-board connector 2 may be a plug connector or a receptacle connector. The terminals 22 are provided for signal transmission, and the transmission current of the terminals 22 is in a range between 0.3 A and 0.5 A.

In this embodiment, the wire assembly 3 is configured as a single-row cable 3a, and is served as a flat cable or a wiring harness. In this embodiment, the wire assembly 3 comprises four high-speed signal pairs 31, two low-speed signal pairs 32, and a plurality of low-speed signal wires 34. The two low-speed signal pairs 32 are arranged between two high-speed signal pairs 31 at left side and two high-speed signal pairs 31 at right side, and each line of the high-speed signal pairs 31 is adjacent to one low-speed signal wire 34. However, it is understood that, the numbers of the positions of the signal pairs as well as the signal wires described in the following embodiments are examples of the instant disclosure for illustrative purposes.

In this embodiment, more specifically, adjacent two pairs of the high-speed signal pairs 31 are spaced by one or more reserved regions and one or more low-speed signal wires 34. In this embodiment, the low-speed signal wire 34 is located adjacent to the high-speed signal pair 31 at the left side, and the low-speed signal wire 34 and the high-speed signal pair 31 at the right side is spaced by one reserved region. Moreover, as mentioned above, the wire assembly 3 may comprise at least one low-speed signal pair 32, and the at least one low-speed signal pair 32 and the high-speed signal pair 31 adjacent to the at least one low-speed signal pair 32 are spaced by one or more reserved regions. The at least one low-speed signal pair 32 is arranged between two high-speed signal pairs 31 at left side and two high-speed signal pairs 31 at right side. Moreover, the low-speed signal wire 34 is located adjacent to the high-speed signal pair 31 at the left side, and the low-speed signal wire 34 and the at least one low-speed signal pair 32 is spaced by one reserved region.

Please refer to FIG. 4. In this embodiment, adjacent two pairs of the high-speed signal pairs 31 are spaced by one reserved and one low-speed signal wire 34. Moreover, the at least one low-speed signal pair 32 and the high-speed signal pair 31 adjacent to the at least one low-speed signal pair 32 are spaced by one reserved region.

In this embodiment, more specifically, the low-speed signal wires 34 are coaxial wires, and the high-speed signal pairs 31 and the at least one low-speed signal pair 32 are also coaxial wires. Moreover, in the case that the low-speed signal wires 34, the high-speed signal pairs 31, and the at least one low-speed signal pair 32 are coaxial wires, the low-speed signal wires 34, the high-speed signal pairs 31, and the at least one low-speed signal pair 32 each comprises a conductive layer 35 (which may be a copper braid shield, or meshed wires made of copper wires, aluminum wires, or the like). Each of the conductive layers 35 is connected to at least one or a plurality of grounding sheets 36.

In this embodiment, more specifically, the single-row electrical wire structure may further comprises at least one or a plurality of electronic wires 33, and the electronic wires 33 may be paired wires or twisted paired wires. Each of the electronic wires 33 may be a ground wire 331, a power wire 332, or a combination of the ground wire 331 and the power wire 332. The electronic wire 33 is located at least one of two sides of the wire assembly 3 and connected to the first circuit board 1. Particularly, in this embodiment, as shown in FIG. 4, two pairs of the ground wires 331 are respectively disposed at two sides of the wire assembly 3 and are respectively disposed at the right side and the left side of the first circuit board 1 (alternatively, two ground wires 331 may be respectively disposed at the left side and the right side of the first circuit board 1). Moreover, in this embodiment, two pairs of the power wires 332 are respectively disposed at the right side and the left side of the first circuit board 1 (alternatively, two power wires 332 may be respectively disposed at the left side and the right side of the first circuit board 1).

Figure 7:
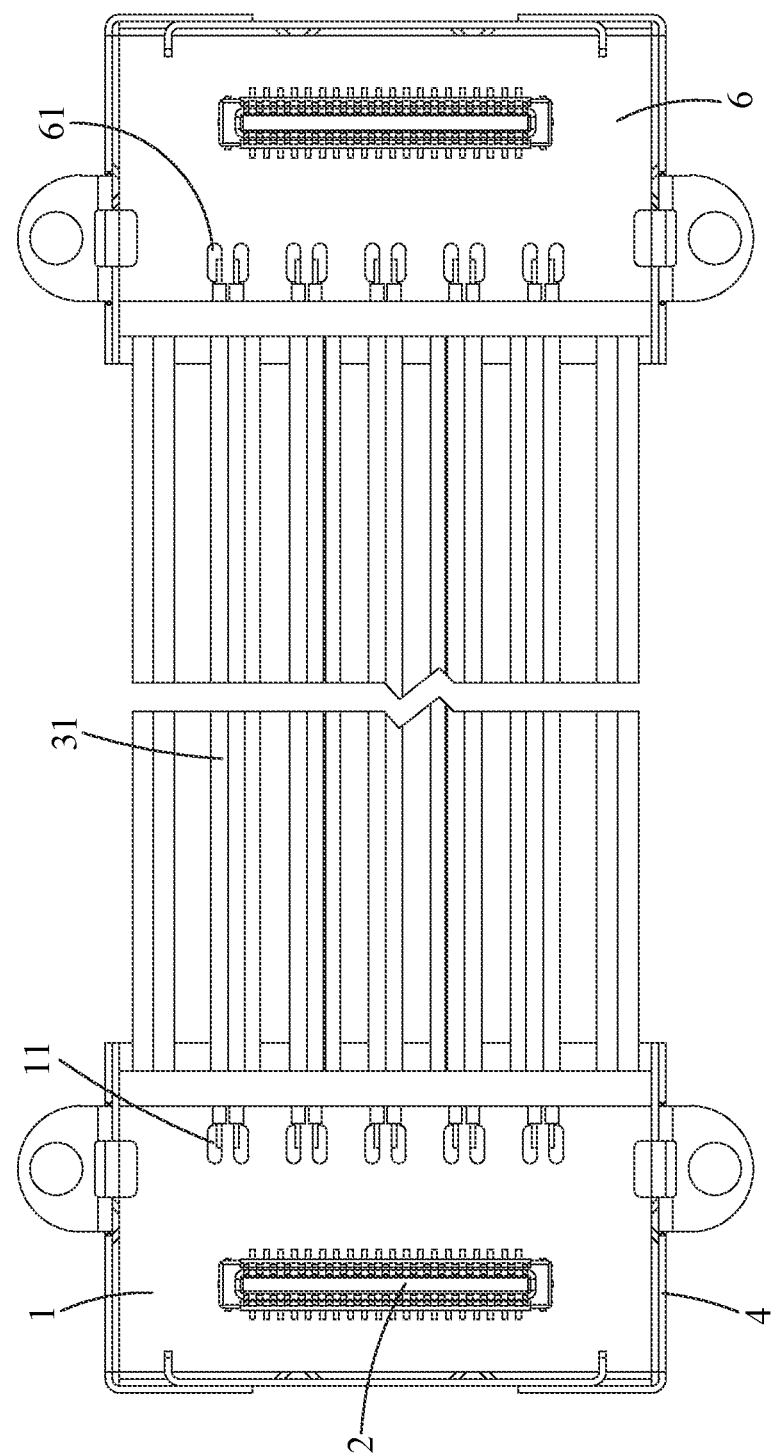
FIG. 7 illustrates a top view showing that the single-row electrical wire structure of the first embodiment is applied to a board-to-board connector.

Please refer to FIG. 7. FIG. 7 illustrates a top view showing that the single-row electrical wire structure of the first embodiment is applied to a board-to-board connector. In this embodiment, more specifically, the electrical connector on the second circuit board 6 may be a board-to-board connector comprising an insulated housing and a plurality of terminals at the insulated housing. The board-to-board connector may be a plug connector or a receptacle connector. The terminals are provided for signal transmission, and the transmission current of the terminals is in a range between 0.3 A and 0.5 A.

Figure 15:
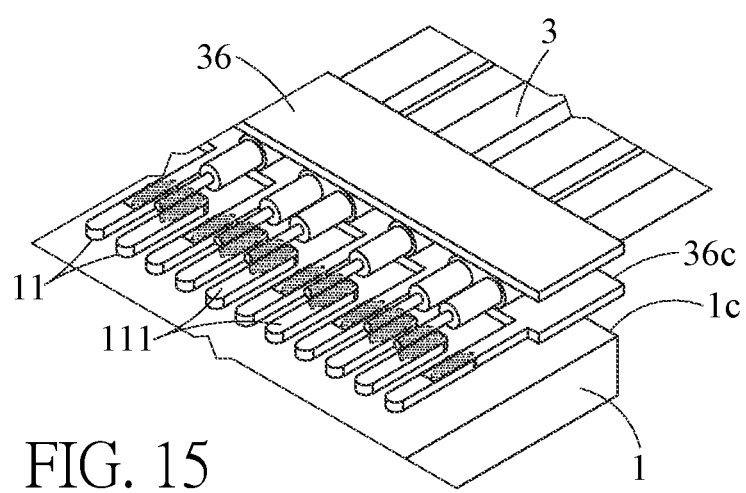
FIG. 15 illustrates a schematic perspective view showing the single-row electrical wire structure of the fourth embodiment is to be welded.
Figure 17:
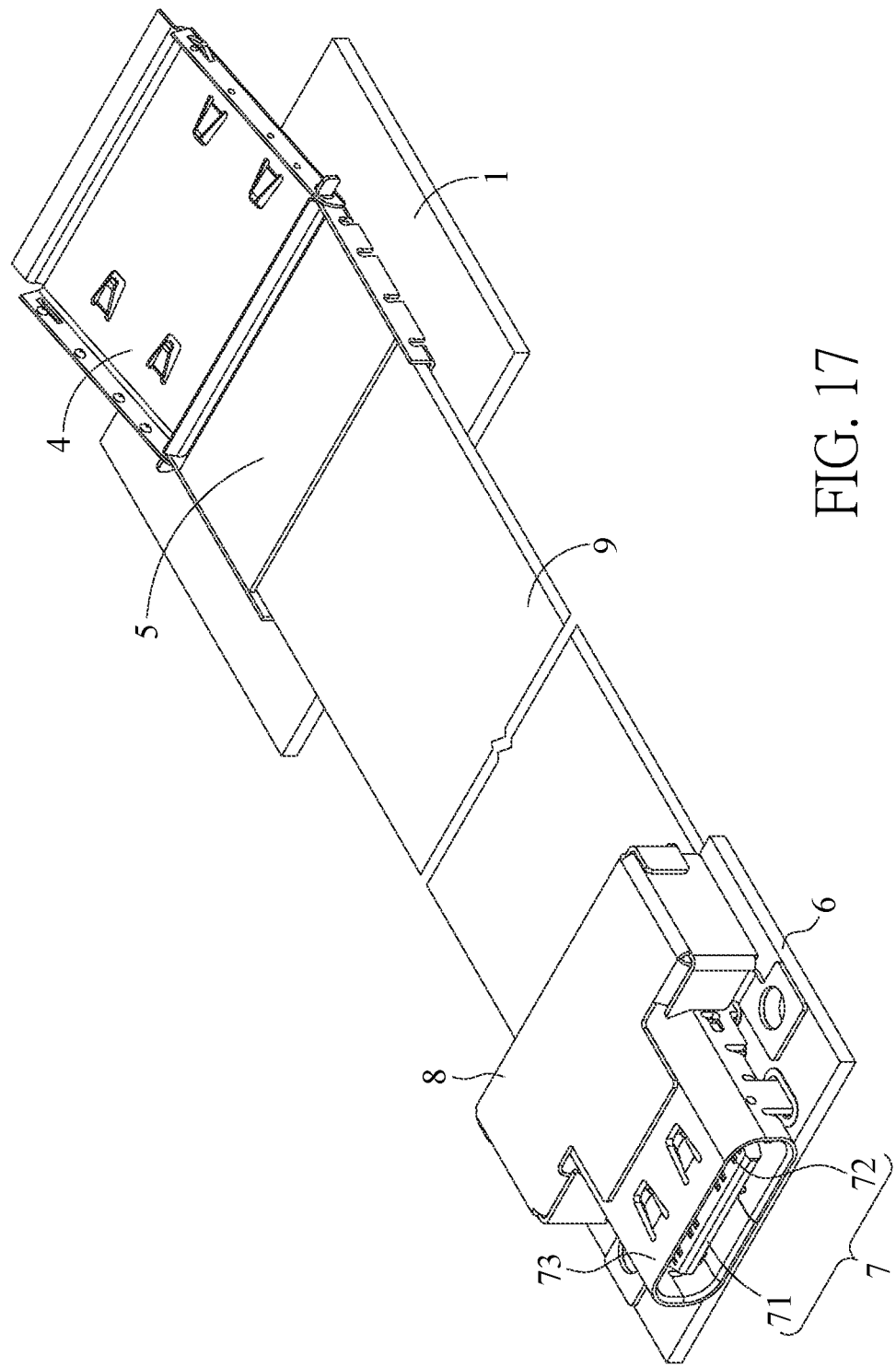
FIG. 17 illustrates a perspective view showing that a first outer cover of the single-row electrical wire structure is opened.

In this embodiment, more specifically, the electrical connector on the second circuit board 6 may be a USB type-C connector 7 (as shown in FIG. 15 and FIG. 17). The USB type-C connector 7 comprises an insulated housing 71, a plurality of terminals 72 at the insulated housing 71, and a metallic shell 73 enclosing the insulated housing 71. In this embodiment, the USB type-C connector 7 may be a receptacle connector.

In this embodiment, the second group of contacts 61 of the second circuit board 6 is connected to the high-speed signal pairs 31, the low-speed signal wires 32, and the electronic wires 33. Moreover, the second group of contacts 61 may be disposed on the upper surface or the lower surface of the second circuit board 6, and the USB type-C connector 7 may be disposed on the upper surface or the lower surface of the second circuit board 6.

Please refer to FIGS. 1 to 6. In this embodiment, more specifically, the single-row electrical wire structure further comprises a plurality of grounding sheets 36 respectively at upper and lower portions of a side portion of each of the high-speed signal pairs 31 and at upper and lower portions of a side portion of the at least one low-speed signal pair 32. In this embodiment, jackets at two ends of the wire assembly 3 are removed by laser, so that the conductive layers 35 of the wire assembly 3 are exposed. Specifically, in this embodiment, the grounding sheets 36 are held at the two ends of the wire assembly 3. The grounding sheets 36 are in contact with the conductive layers 35 of the high-speed signal pairs 31 and the conductive layer 35 of the at least one low-speed signal pair 32. Moreover, each of the grounding sheets 36 is electrically connected to the first circuit board 1 so as to provide conduction and grounding effects.

Please refer to FIGS. 2 and 3. In this embodiment, more specifically, the side portions 36c of the grounding sheets 36 flush with a side portion 1c of the first circuit board 1, but embodiments are not limited thereto.

Figure 8:
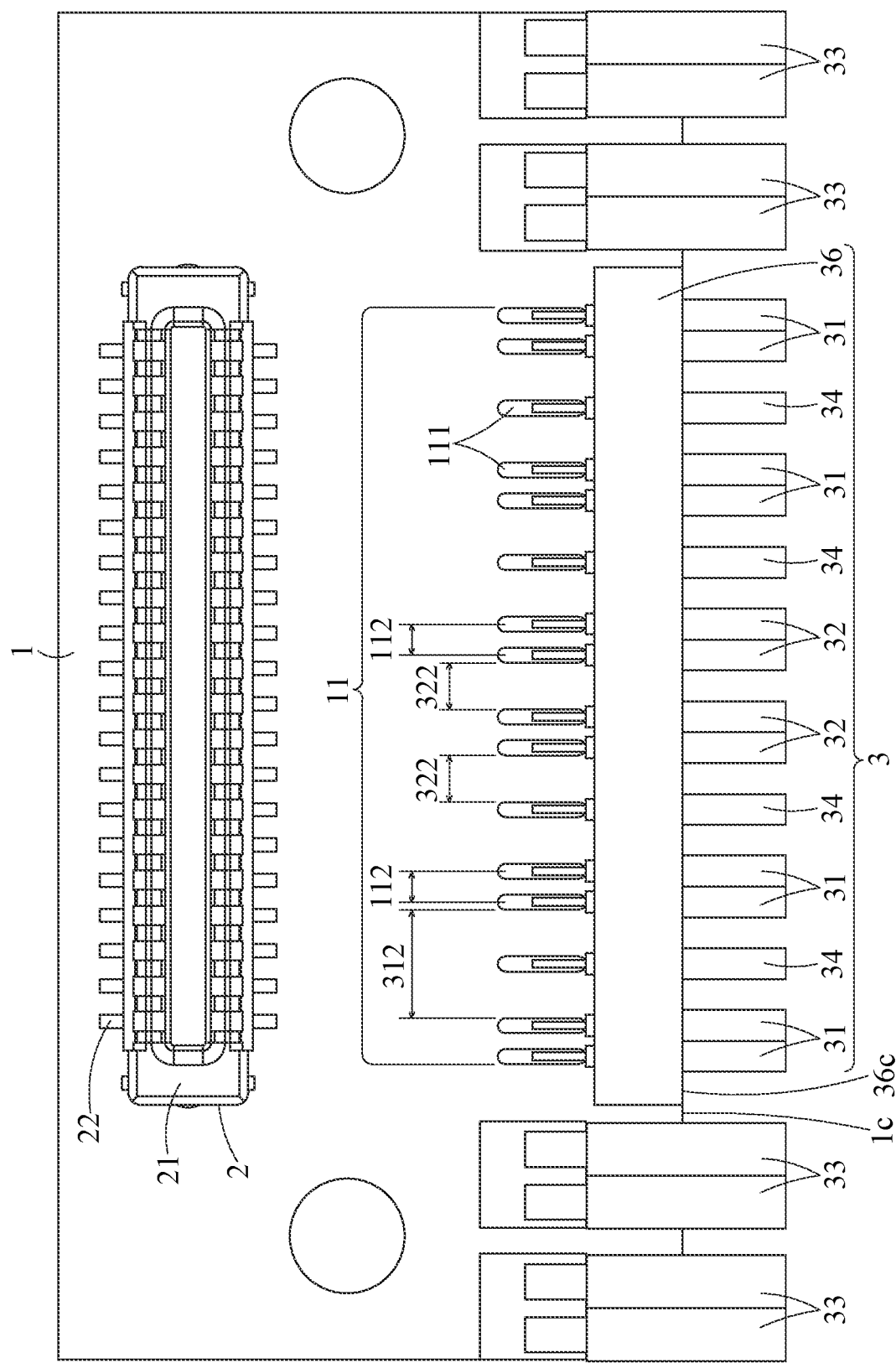
FIG. 8 illustrates a top view of a single-row electrical wire structure according to a second embodiment of the instant disclosure.
Figure 9:
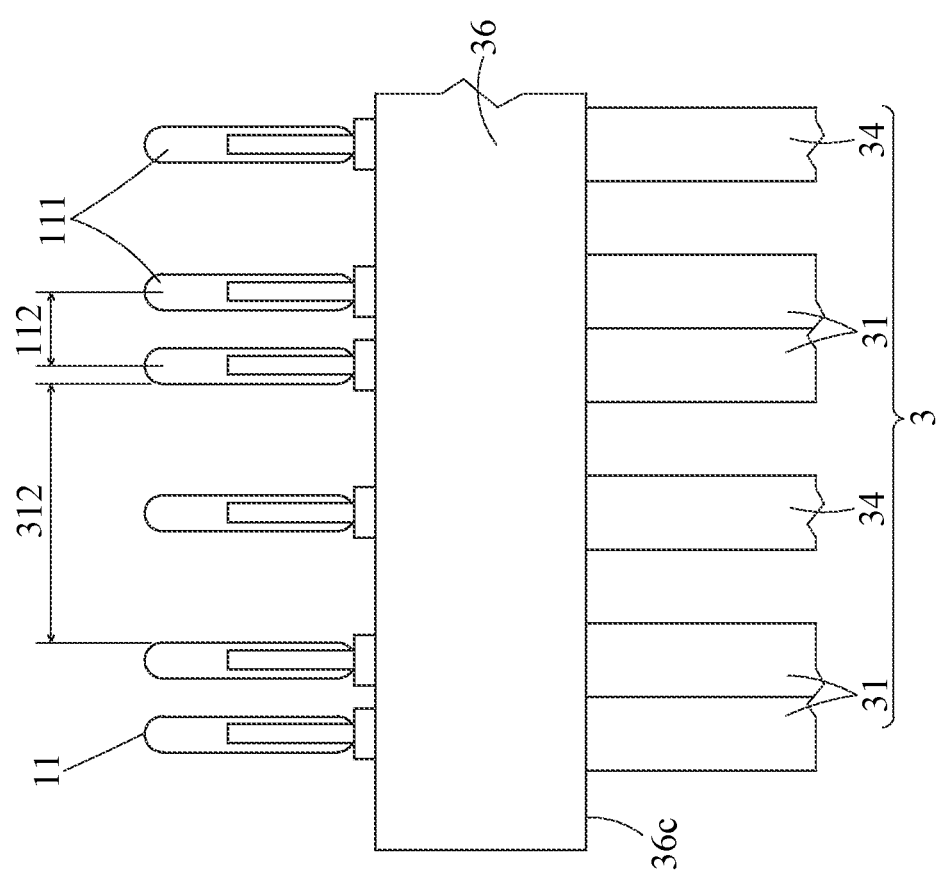
FIG. 9 illustrates an enlarged partial view of FIG. 8.

In the foregoing embodiments, one low-speed signal pair 32 is utilized, but embodiments are not limited thereto. Please refer to FIGS. 8 and 9. A single-row electrical wire structure according to a second embodiment of the instant disclosure is illustrated. FIG. 8 illustrates a top view of the single-row electrical wire structure of the second embodiment. FIG. 9 illustrates an enlarged partial view of FIG. 8. In the second embodiment, the wire assembly 3 comprises a plurality of low-speed signal pairs 32. A second spacing 322 between a contact 111 in the first group of contacts 11 connected to a first low-speed signal pair of the low-speed signal pairs 32 and a contact 111 in the first group of contacts 11 connected to a second low-speed signal pair of the low-speed signal pairs 32 adjacent to the first low-speed signal pair is at least equal to or greater than 1.5 times of the width 112.

Please refer to FIG. 8. In this embodiment, adjacent two pairs of the high-speed signal pairs 31 are spaced by two reserved region and one low-speed signal wire 34. In other words, one reserved region is configured between one of the low-speed signal wires and the high-speed signal pair at the left side thereof and another reserved region is configured between the low-speed signal wire and the high-speed signal pair at the right side thereof. Moreover, the at least one low-speed signal pair 32 and the high-speed signal pair 31 adjacent to the at least one low-speed signal pair 32 are spaced by two reserved regions. Furthermore, one low-speed signal wire is configured between at least one of the low-speed signal pairs and the high-speed signal pair adjacent to the at least one of the low-speed signal pairs. In this embodiment, one reserved region is configured between one low-speed signal wire and the at least one of the low-speed signal pairs at the left side (or right side) thereof, and another reserved region is configured between the low-speed signal wire and the high-speed signal pair at the right side (or left side) thereof.

Figure 10:
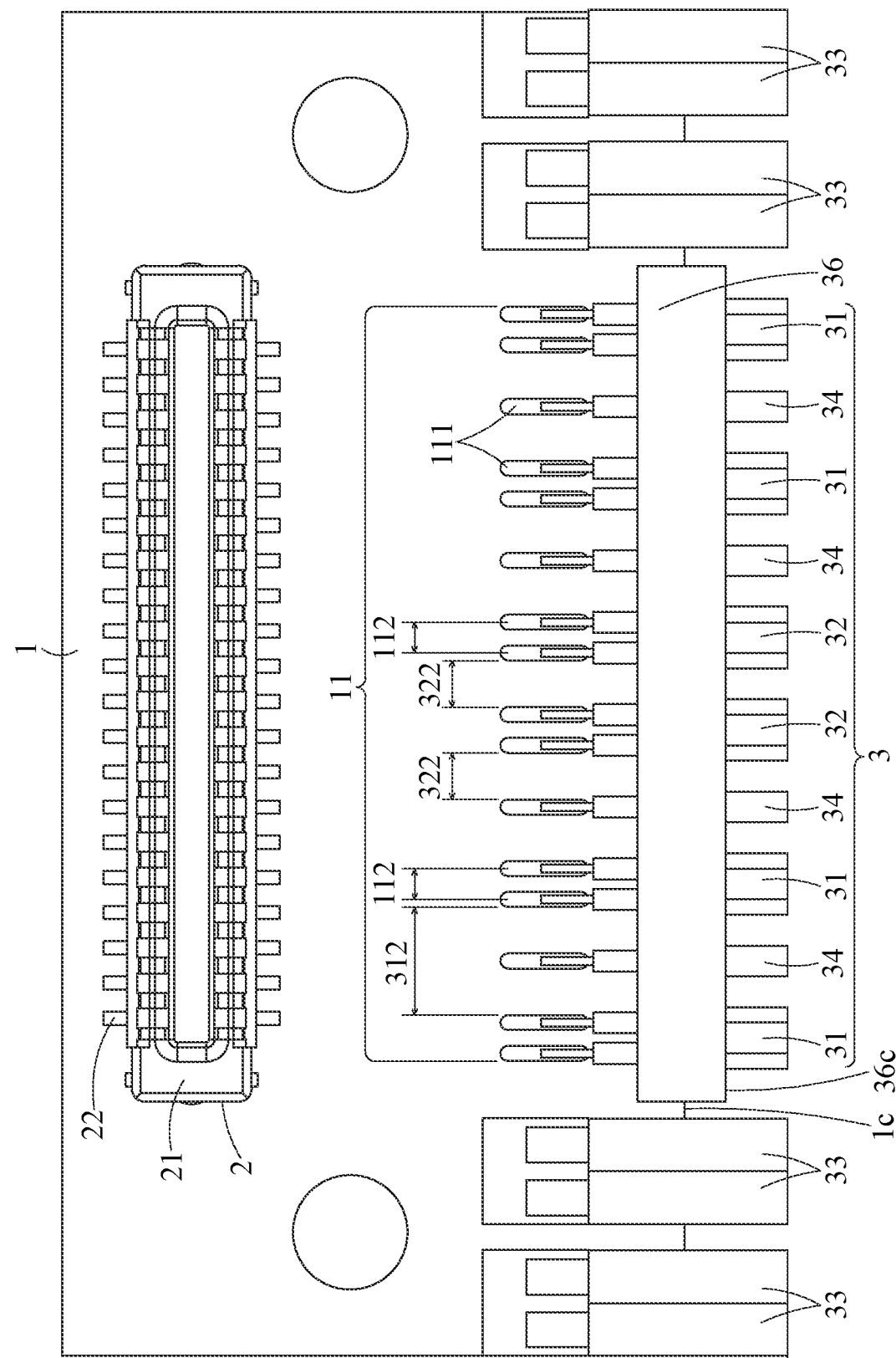
FIG. 10 illustrates a top view of a single-row electrical wire structure according to a third embodiment of the instant disclosure.
Figure 11:
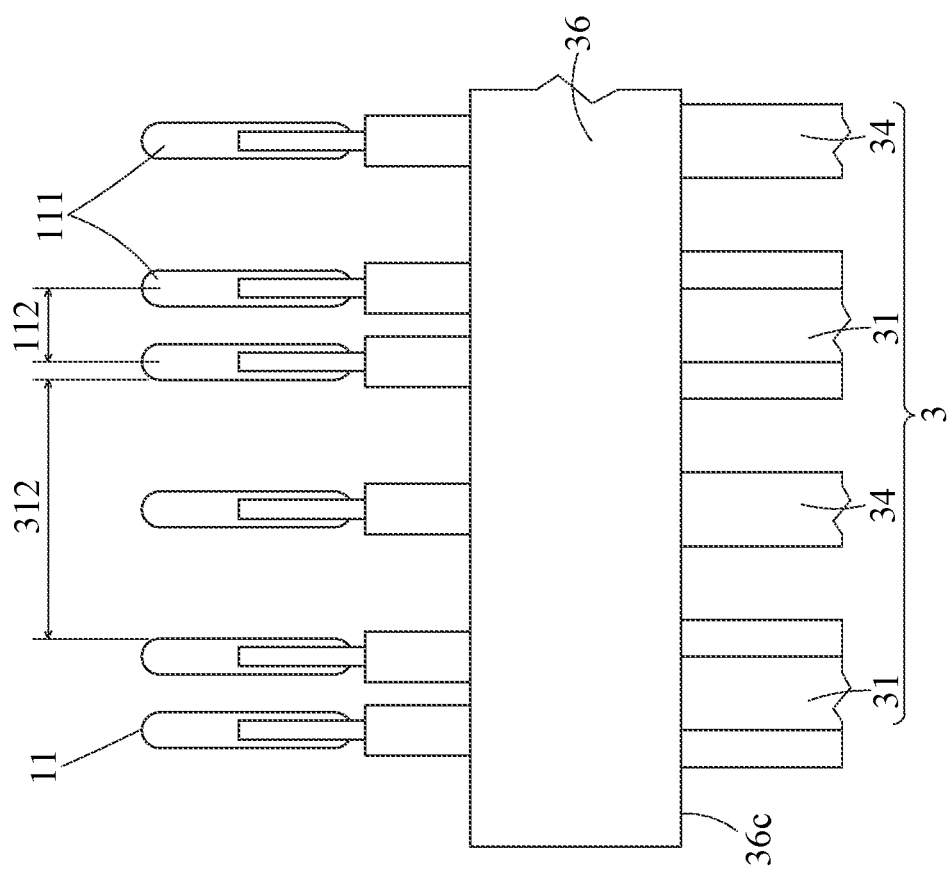
FIG. 11 illustrates an enlarged partial view (1) of FIG. 10.
Figure 12:
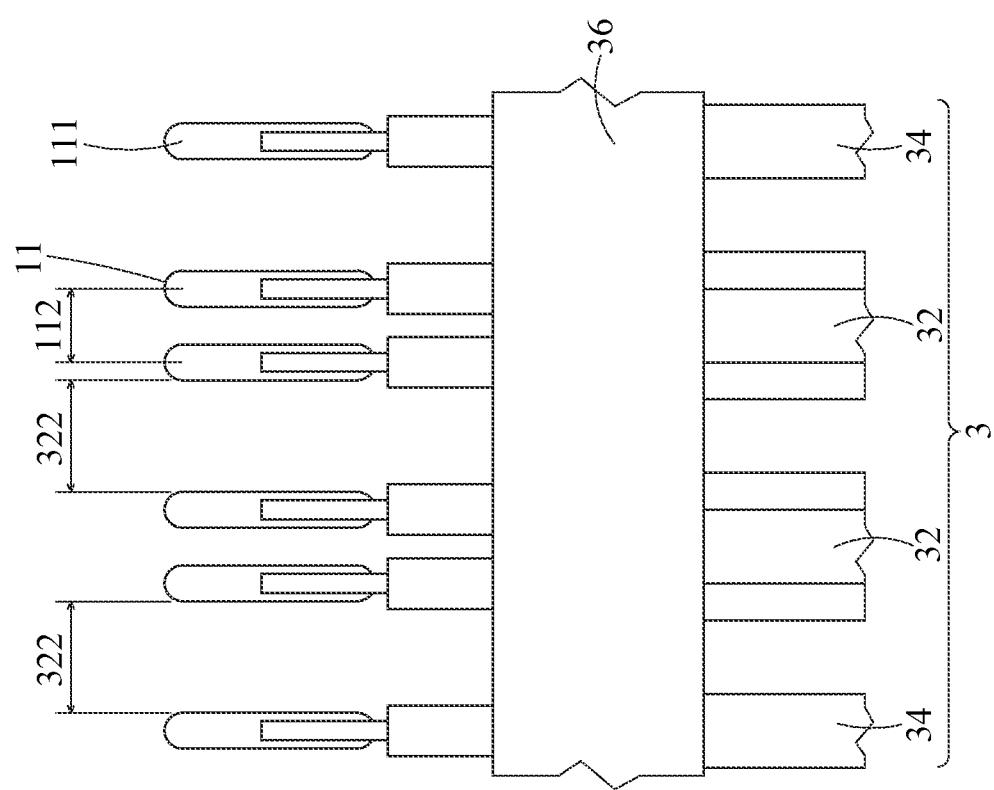
FIG. 12 illustrates an enlarged partial view (2) of FIG. 10.

Please refer to FIGS. 10 to 12. A single-row electrical wire structure according to a third embodiment of the instant disclosure is illustrated. FIG. 10 illustrates a top view of the single-row electrical wire structure of the third embodiment. FIG. 11 illustrates an enlarged partial view (1) of FIG. 10. FIG. 12 illustrates an enlarged partial view (2) of FIG. 10.

In the third embodiment, the high-speed signal pairs 31 and the at least one low-speed signal pair 32 are twin coaxial wires.

Please refer to FIG. 10. In this embodiment, two pairs of the high-speed signal pairs 31 are spaced by two reserved region and one low-speed signal wire 34. In other words, one reserved region is configured between one of the low-speed signal wires and the high-speed signal pair at the left side thereof and another reserved region is configured between the low-speed signal wire and the high-speed signal pair at the right side thereof. Moreover, the at least one low-speed signal pair 32 and the high-speed signal pair 31 adjacent to the at least one low-speed signal pair 32 are spaced by two reserved regions.

Figure 13:
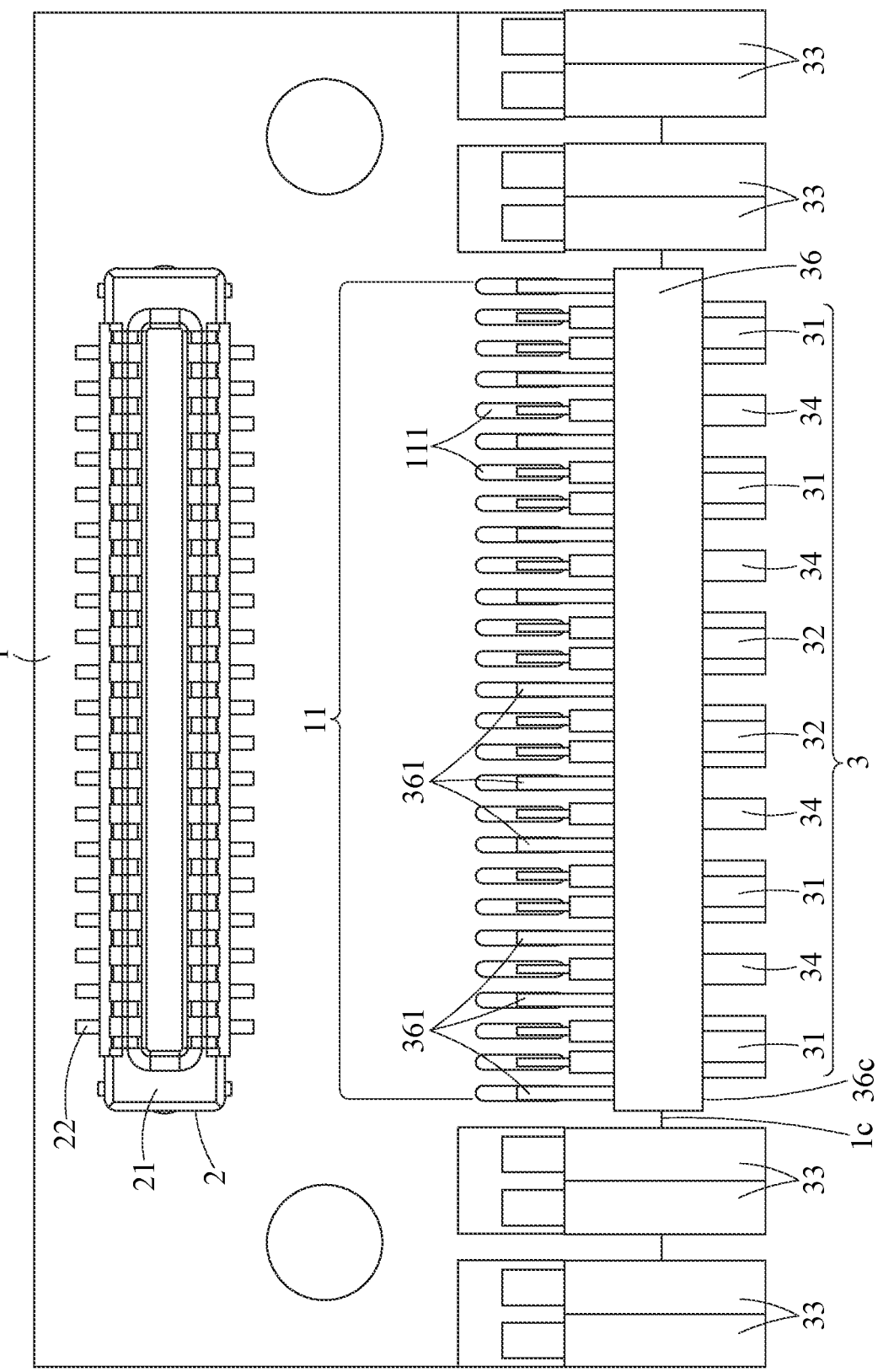
FIG. 13 illustrates a top view of a single-row electrical wire structure according to a fourth embodiment of the instant disclosure.
Figure 14:
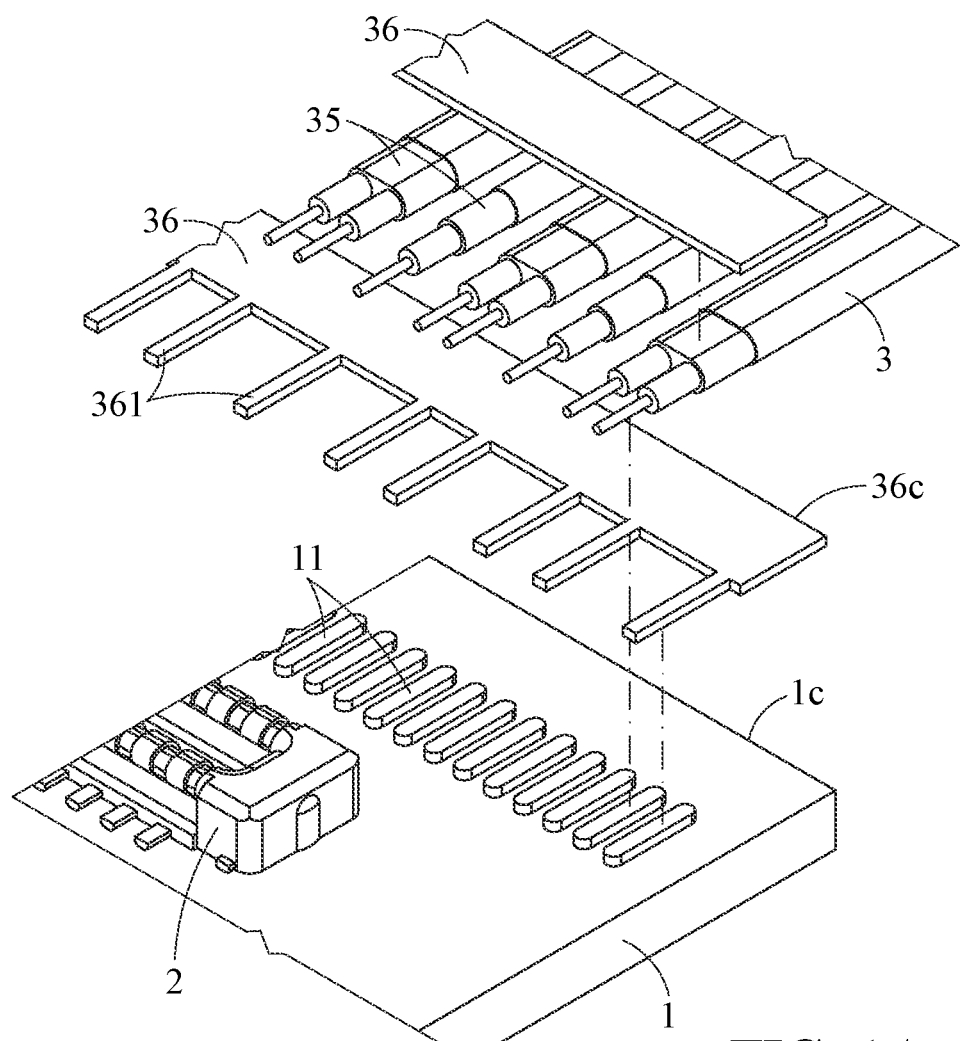
FIG. 14 illustrates an exploded view of the single-row electrical wire structure of the fourth embodiment.

Please refer to FIGS. 13 to 15. A single-row electrical wire structure according to a fourth embodiment of the instant disclosure is illustrated. FIG. 13 illustrates a top view of the single-row electrical wire structure of the fourth embodiment. FIG. 14 illustrates an exploded view of the single-row electrical wire structure of the fourth embodiment. FIG. 15 illustrates a schematic perspective view showing the single-row electrical wire structure of the fourth embodiment is to be welded. In the fourth embodiment, a plurality of block members 361 extends from a side portion 36c of at least one of the grounding sheets 36. In this embodiment, the block members 361 are disposed at the side portion 36c of the grounding sheet 36 and spaced with each other, so that the grounding sheet 36 is about of a comb structure. In this embodiment, the grounding sheets 36 (including the grounding sheet(s) 36 with the block members 361 and the grounding sheet(s) 36 without the block members 361) are held at the two ends of the wire assembly 3. The grounding sheets 36 are in contact with the conductive layers 35 of the high-speed signal pairs 31 and the conductive layer 35 of the at least one low-speed signal pair 32. Moreover, each of the block members 361 is electrically connected to the first circuit board 1 so as to provide conduction and grounding effects.

Please refer to FIGS. 14 and 15. In this embodiment, the side portions 36c of the grounding sheets 36 protrude from the side portion 1c of the first circuit board 1. Hence, the area of the grounding sheets 36 disposed on the first circuit board 1 is reduced, thereby reducing the occupation area of the grounding sheets 36 on the first circuit board 1.

Figure 16:
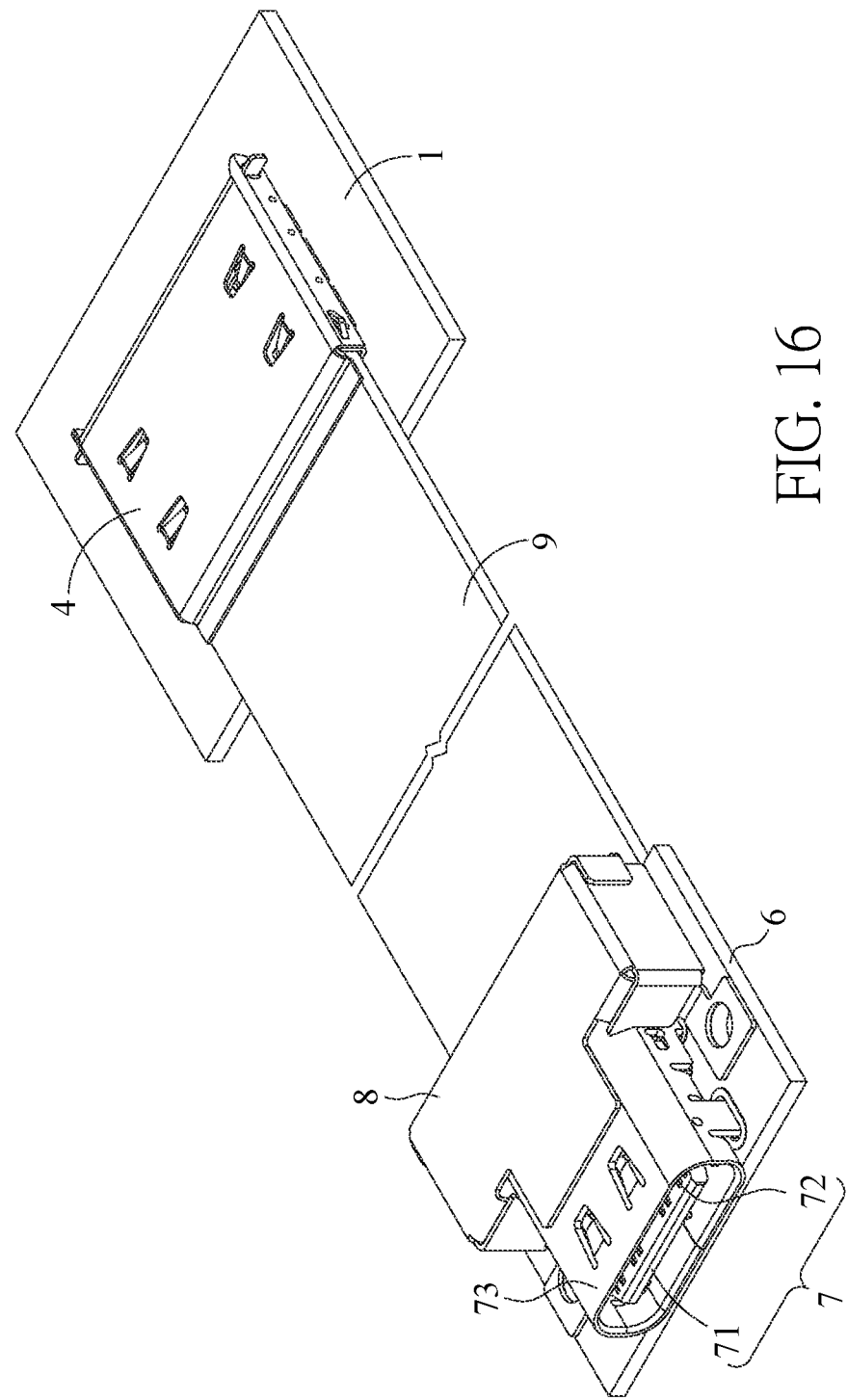
FIG. 16 illustrates a perspective view of a single-row electrical wire structure according to a fifth embodiment of the instant disclosure.

Please refer to FIGS. 2, 16, and 17. A single-row electrical wire structure according to a fifth embodiment of the instant disclosure is illustrated. FIG. 16 illustrates a perspective view of the single-row electrical wire structure of the fifth embodiment. FIG. 17 illustrates a perspective view showing that a first outer cover of the single-row electrical wire structure is opened. Please together refer to FIGS. 2, 16, and 17, in the fifth embodiment, the single-row electrical wire structure further comprises a metallic covering member 9 (which is a shielding member comprising metal material such as conductive fabric, copper foil, or aluminum foil) covering the wire assembly 3. In this embodiment, by covering the metallic covering member 9 out of the wire assembly 3, the electromagnetic interference (EMI)/radiofrequency interference (RFI) issues can be improved effectively when the structure is used for high-speed transmission.

As shown in FIGS. 2, 16, and 17, in this embodiment, more specifically, the single-row electrical wire structure further comprises a first outer cover 4 (a metal cover) on the first circuit board 1 to cover the high-speed signal pairs 31. Therefore, when the high-speed signal pairs 31 are used to transmit high-speed signals, the EMI/RFI issues can be improved. In this embodiment, a circuit board 5 covers the first circuit board 1, and a board-to-board connector (not shown) is disposed on the circuit board 5. The board-to-board connector is inserted into the board-to-board connector 2 on the first circuit board 1 and electrically connected to the board-to-board connector 2 on the first circuit board 1.

In this embodiment, more specifically, one end of the metallic covering 9 is in contact with the grounding sheets 36. Moreover, in this embodiment, a portion of the grounding sheet 36 protruding from the side portion 1c of the first circuit board 1 is provided for being attached to the metallic covering member 9 (not shown). In this embodiment, the protruded portion at the side portion 36c of the grounding sheet 36 is provided for being attached to the metallic covering member 9 so as to improve the fixation of the metallic covering member 9 on the single-row electrical wire structure.

Figure 18:
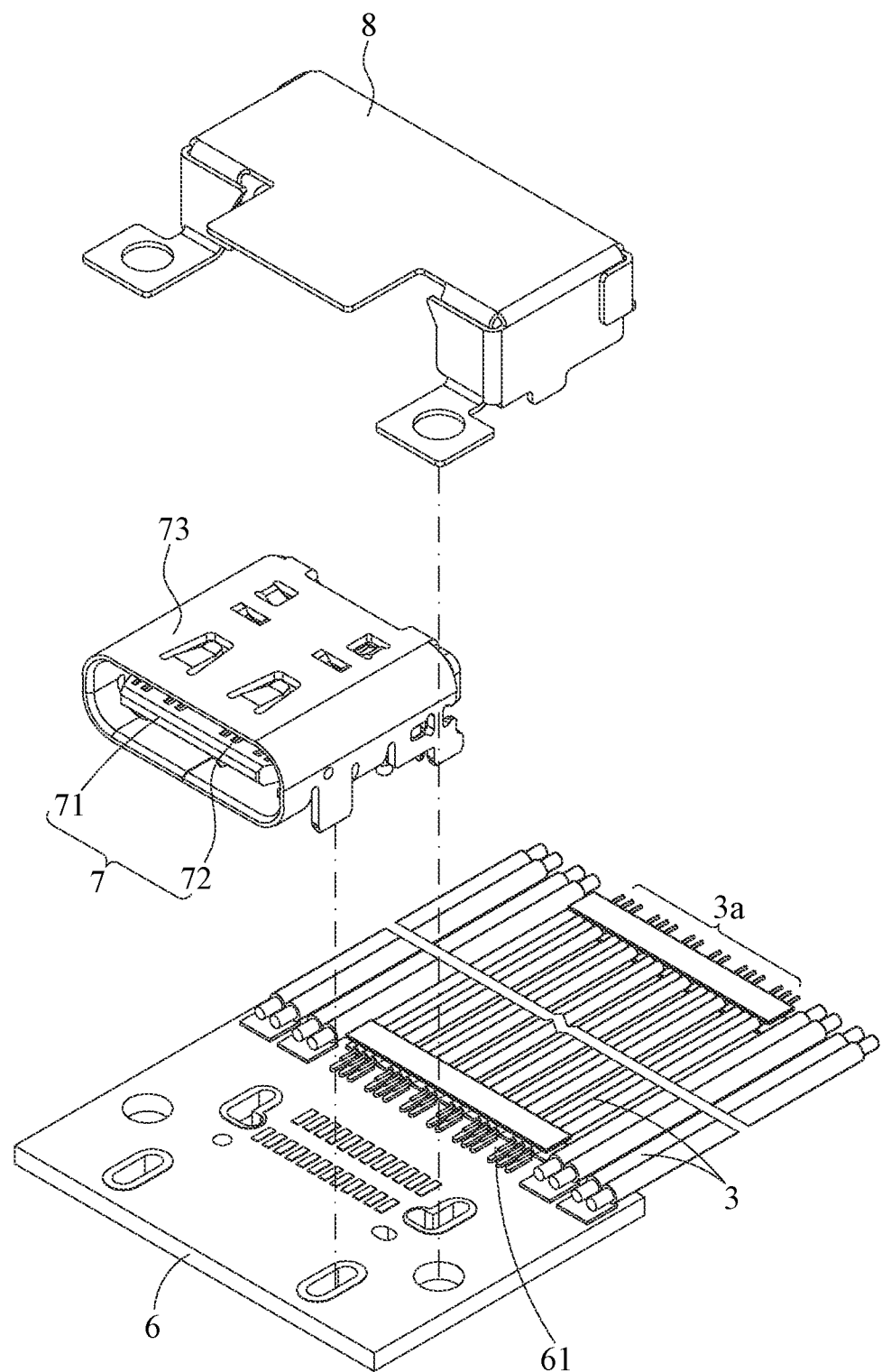
FIG. 18 illustrates an exploded view showing the single-row electrical wire structure is applied to a USB type-C connector.

Please refer to FIGS. 2 and 18. FIG. 18 illustrates an exploded view showing the single-row electrical wire structure is applied to a USB type-C connector. In this embodiment, more specifically, the single-row electrical wire structure further comprises a second outer cover 8 (a metallic cover) on the second circuit board 6 to cover the high-speed signal pairs wires 31. Therefore, when the high-speed signal wires 31 are used to transmit high-speed signals, the EMI/RFI issues can be improved.

Figure 19:
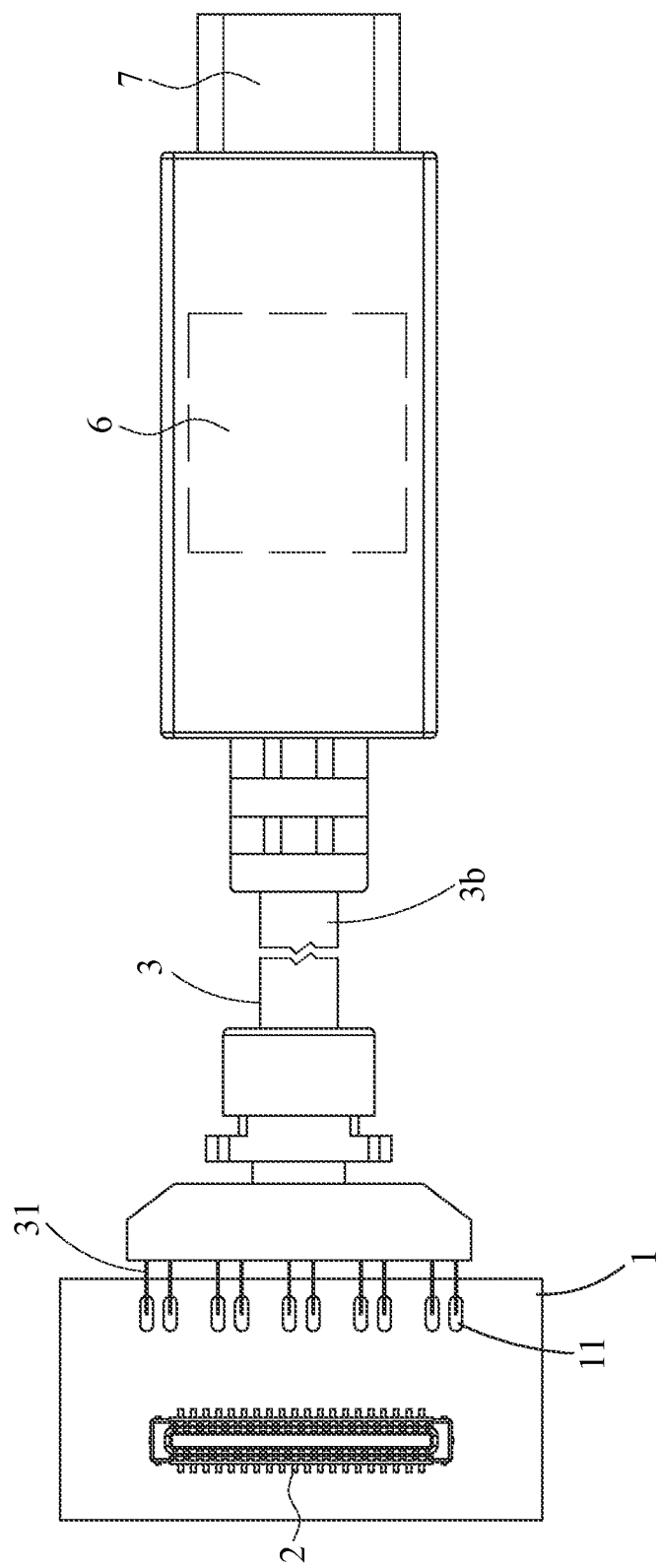
FIG. 19 illustrates a top view of a single-row electrical wire structure according to a sixth embodiment of the instant disclosure.

Please refer to FIGS. 2 and 19. A single-row electrical wire structure according to a sixth embodiment of the instant disclosure is illustrated. FIG. 19 illustrates a top view of the single-row electrical wire structure of the sixth embodiment. In the sixth embodiment, the wire assembly 3 is a cable 3b. One of two ends of the wire assembly 3 is connected to the USB type-C connector 7, and the other end of the wire assembly 3 is connected to the first group of contacts 11 on the first circuit board 1. In this embodiment, the one end of the wire assembly 3 is connected to the second circuit board 6 in the USB type-C connector 7. Specifically, in this embodiment, the wire assembly 3 and the USB type-C connector 7 are formed as a semi-finished product; in other words, the wire assembly 3 is the cable extending from the end portion of the USB type-C connector 7, and the USB type-C connector 7 may be a plug connector.

According to one or some embodiments of the single-row electrical wire structure of the instant disclosure, the amount of used material for the wire assembly is reduced, the spacing between the high-speed signal pairs are increased, and the crosstalk interferences are improved with altering the arrangement of the wires. Two sides of each of the signal pairs and two sides of each of the signal wires are devoid of the ground wires, and the signal pairs and wires are shielded with the metallic shell, thereby preventing from the EMI/RFI issues upon transmitting high-speed signals. Moreover, the height of the single-row electrical wire structure is slightly less than the height of the dual-row electrical wire structure.

Furthermore, the grounding sheets are held at the two ends of the wire assembly and fixed on the first circuit, the grounding sheets are in contact with the conductive layers of the wire assembly and electrically connected to the first circuit board so as to provide conduction and grounding effects.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A single-row electrical wire structure, comprising:
    a first circuit board, wherein a board-to-board connector is on the first circuit board; the first circuit board comprises a first group of contacts arranged into a single row, a distance between center portions of adjacent two contacts of the first group of contacts forms a width; and
    a wire assembly, comprising a plurality of high-speed signal pairs and a plurality of low-speed signal pairs, wherein two ends of each of the high-speed signal pairs and two ends of each of the low-speed signal pairs are connected to the first group of contacts, a first spacing between a contact in the first group of contacts corresponding to a first high-speed signal pair of the high-speed signal pairs and a contact in the first group of contacts corresponding to a second high-speed signal pair of the high-speed signal pairs adjacent to the first high-speed signal pair is at least equal to or greater than 2 times of the width, and a second spacing between a contact in the first group of contacts corresponding to a first low-speed signal pair of the low-speed signal pairs and a contact in the first group of contacts corresponding to a second low-speed signal pair of the low-speed signal pairs adjacent to the first low-speed signal pair is at least equal to or greater than 1.5 times of the width.

2. The single-row electrical wire structure according to claim 1, further comprising a second circuit board, wherein an electrical connector is on the second circuit board; the second circuit board comprises a second group of contacts arranged into a single row, the second group of contacts is connected to the other end of the wire assembly.

3. The single-row electrical wire structure according to claim 1, further comprising a low-speed signal wire, wherein the low-speed signal wire is a coaxial wire or an electronic wire, the high-speed signal pairs and at least one of the low-speed signal pairs are coaxial wires, twin coaxial wires, or electronic wires.

4. The single-row electrical wire structure according to claim 3, wherein the low-speed signal wire, the high-speed signal pairs, and the at least one of the low-speed signal pairs are the coaxial wires and respectively comprise a conductive layer, the conductive layers are connected to a grounding sheet.

5. The single-row electrical wire structure according to claim 1, further comprising at least one grounding sheet at upper and lower portions of a side portion of each of the high-speed signal pairs and at upper and lower portions of a side portion of at least one of the low-speed signal pairs.

6. The single-row electrical wire structure according to claim 5, wherein a plurality of block members extends from a side portion of the at least one grounding sheet, and each of the block members is electrically connected to the first circuit board.

7. The single-row electrical wire structure according to claim 5, wherein a portion of the at least one grounding sheet protruding from a side portion of the first circuit board is in contact with a metallic covering member.

8. The single-row electrical wire structure according to claim 1, further comprising at least one electronic wire, wherein the at least one electronic wire is at least one of two sides of the wire assembly and connected to the first circuit board.

9. The single-row electrical wire structure according to claim 1, further comprising a first outer cover, wherein the first outer cover is on the first circuit board to cover the high-speed signal pairs.

10. The single-row electrical wire structure according to claim 1, wherein the electrical connector is another board-to-board connector, the another board-to-board connector comprises an insulated housing and a plurality of terminals at the insulated housing, the another board-to-board connector is a receptacle connector or a plug connector.

11. The single-row electrical wire structure according to claim 1, wherein the electrical connector is a USB type-C connector, the USB type-C connector comprises an insulated housing, a plurality of terminals at the insulated housing, and a metallic shell enclosing the insulated housing.

* * * * *